(12) United States Patent
Machimura

(10) Patent No.: US 7,380,183 B2
(45) Date of Patent: May 27, 2008

(54) SEMICONDUCTOR CIRCUIT APPARATUS AND SCAN TEST METHOD FOR SEMICONDUCTOR CIRCUIT

(75) Inventor: Hiroki Machimura, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 167 days.

(21) Appl. No.: 11/073,864

(22) Filed: Mar. 8, 2005

(65) Prior Publication Data

US 2005/0204227 A1    Sep. 15, 2005

(30) Foreign Application Priority Data

Mar. 10, 2004  (JP) ............................. 2004-066997

(51) Int. Cl.
   *G01R 31/28*   (2006.01)
   *G11C 29/00*   (2006.01)

(52) U.S. Cl. ....................... 714/726; 714/729; 714/718

(58) Field of Classification Search ................. 714/726
   See application file for complete search history.

(56) References Cited

U.S. PATENT DOCUMENTS 5,477,545 A * 12/1995 Huang ...................... 714/727

6,327,683 B1 * 12/2001 MacCormack .............. 714/726
2004/0128604 A1 * 7/2004 Guettaf ...................... 714/741

FOREIGN PATENT DOCUMENTS

| JP | 11-083958 | 3/1999 |
| JP | 2001-042008 | 2/2001 |
| KR | 2003-0027989 | 4/2003 |

OTHER PUBLICATIONS

Kwon et al., FakeFault: A Silicon Debug Software Tool for Microprocessor Embedded Memory Arrays, 1998, IEEE, pp. 727-732.*

* cited by examiner

*Primary Examiner*—Jacques Louis-Jacques
*Assistant Examiner*—John J. Tabone, Jr.
(74) *Attorney, Agent, or Firm*—Young & Thompson

(57) ABSTRACT

A semiconductor circuit apparatus, on which a scan test can be conducted, has a plurality of circuit sections. The semiconductor circuit apparatus includes a scan chain having a plurality of flip-flops for transmitting test data. The semiconductor circuit apparatus also has a first macro cell placed in a path between flip-flops included in the scan chain, a first bypass path bypassing the first macro cell, a first selection circuit selecting the first macro cell or the first bypass path, a second macro cell placed in a path between flip-flops included in the scan chain, a second bypass path bypassing the second macro cell, and a second selection circuit selecting the second macro cell or the second bypass path. The first selection circuit and the second selection circuit operate individually.

15 Claims, 6 Drawing Sheets

SEMICONDUCTOR CIRCUIT APPARATUS AND SCAN TEST METHOD FOR SEMICONDUCTOR CIRCUIT

BACKGROUND OF THE INVENTION

1. Field of the Invention

The present invention relates to a semiconductor circuit apparatus available to a scan test and to a scan test method for a semiconductor circuit.

2. Description of Related Art

With an increase in the number of transistors and other electronic components contained in a large-scale integrated circuit, which is abbreviated hereinafter as "LSI", demand for more highly integrated and higher performance LSI is growing, and the number of macro cells such as memories and CPU integrated into the LSI is increasing accordingly. In order to improve the manufacturing quality of the LSI with a number of macro cells integrated thereto, it is necessary to maintain high test quality in the functional test of the LSI. A scan test having a high fault detection rate is therefore widely used. Further, a technique called a sequential scan has been introduced, which allows a connection test of a macro cell with surrounding circuits and a path delay test on a circuit including macro cells in the LSI.

The scan test is a technique that forms a shift register with a serial connection path connecting flip-flops inside an LSI, and directly controls and observes each flip-flop from outside. This shift register chain is called a scan chain. It allows dividing a logic circuit inside the LSI into several parts using the flip-flop in the LSI as an input or output point, and testing each part. This technique facilitates the generation of test patterns that increases exponentially with respect to the circuit scale.

The scan test process first performs shift operation to set the value of each flip-flop, which is called "scan shift". It then input each flip-flop value to surrounding combinational circuits to activate the circuit, which is called "launch". The value obtained by the launch is captured by the flip-flop at the end point of a path to be tested, which is called "capture". Finally, the test process again performs the shift operation to the scan chain and outputs the result to the outside, thereby detecting faults inside the LSI. This cycle is repeated with various test patterns and exhaustively on various paths to be tested, thereby accomplishing the functional test of the logic circuit inside the LSI.

A conventional method of the scan test is as follows. In order to eliminate the need for setting an output value of a macro cell, a path bypassing the macro cell between the input terminal and the output terminal is formed. A selector is connected to the output terminal of the macro cell. During the scan test, the selector is controlled to select the bypass path, thereby conducting the scan test without activating the macro cell. This method is referred to hereinafter as a basic scan. This method requires the LSI to have a control terminal for controlling the selector from outside.

Japanese Unexamined Patent Application Publication No. 2001-42008 (Fujii et. al.) discloses a technique that places a path bypassing a macro cell in an LSI to separate the macro cell from other logic circuits and conducts the basic scan test only on the other logic circuits. Japanese Unexamined Patent Application Publication No. 11-83958 (Takahashi) discloses a test pattern generator for an LSI having a plurality of partial circuits. When testing a specific partial circuit, this technique directly gives input through a selector placed immediately before the specific partial circuit and directly obtains output through a selector placed immediately after the specific partial circuit, thereby conducting the scan test per divided partial circuits.

On the other hand, the sequential scan test aims to confirm the connection between a macro cell and a surrounding circuit and to detect a delay fault in a circuit including a macro cell. Thus, it is necessary to conduct the scan test without bypassing the macro cell, and the macro cell needs to operate to set output values. Hence, the sequential scan test has the problem of a heavy processing load on a test design tool such as Automatic Test Pattern Generator (ATPG) due to complexity in test pattern generation. Further, given recent trend of increasing number of macro cells incorporated into the circuit, there are cases where a plurality of macros exists on a logic path for which fault detection is to be performed. The processing load on a test design tool multiplies exponentially for the number of incorporated macro cells. It leads to an increase in the runtime of the test design tool and sometimes exceeds the processing capacity of the test design tool.

If the sequential scan having the above problem is conducted on the LSI disclosed by Fujii et.al., the bypass setting causes all macro cells to be bypassed, thus failing to conduct the sequential scan on the path including some of the macro cells. On the contrary, no bypass setting leads to activate all the macro cells included in a logic cone of a path to be tested and set the output values, resulting in an increase in a test pattern generation time and a test time. This fails to efficiently conduct the sequential scan that detects path delay faults in the path including the macro cell.

Further, Takahashi merely discloses the test pattern generator that divides an LSI to be tested into several partial circuits having a suitable circuit scale and generates a test pattern for each partial circuit to reduce the number of test patterns. The disclosed technique of dividing the circuit does not allow testing on the path beginning at a flip-flop in a partial circuit and ending at a flip-flop in another partial circuit. Thus, this technique is different in the test method from the scan test that connects flip-flops inside the LSI by a scan chain. It is therefore incapable of solving the problem of an increase in a test pattern generation time and a test time when conducting the sequential scan on a path including macro cells.

FIG. 5 is a block diagram showing a logic circuit of an LSI which is available to a conventional basic scan test. Macro cells 41 and 42 and flip-flops 511 to 519 operate in synchronization with one input clock. A scan chain is formed from an input terminal SCANIN through the flip-flops 511 to 519 to an output terminal SCANOUT. When conducting the scan test, the scan chain repeats the scan shift operation for each clock, thereby determining the values of the flip-flops 511 to 519. For example, in the configuration of FIG. 5, the scan shift operation of nine clocks in total determines the value of each flip-flop 511 to 519. Controlling the output value of each flip-flop by the scan shift operation allows each flip-flop to serve as a virtual input or output terminal. This enables testing of the LSI per a small logic cone composed only of combinational circuits that begins with a flip-flop and ends with another flip-flop. Combinational logic circuits 52 and 53 are activated by input of the set value of the flip-flop. The result value is latched by the flip-flop at the end of the logic cone in a next clock cycle. The shift operation by the scan chain is then repeated, thereby outputting the value captured by the flip-flop to the SCANOUT terminal. The value is compared with an expected value to detect a fault.

When conducting the basic scan test on the LSI of FIG. 5, selectors 43 and 44 are collectively set to select bypass paths 66 and 67 that bypass macro cells 41 and 42, respectively, by a signal from an input terminal BYPASS through a control line. Thus, setting the input terminals of the macro cells connected to the bypass paths to an expected value eliminates the need for activating the macro cells.

On the other hand, the sequential scan test requires setting the output value of the macro cells without bypassing them. Thus, to conduct the sequential scan test on the LSI of FIG. 5, it is necessary to collectively set the selectors 43 and 44 to select output paths from the macro cells by a signal from the input terminal BYPASS. Thus, when testing a path including the macro cell 41, for example, if the macro cell 42 is included in the logic cone of the path to be tested, it is required to activate not only the macro cell 41 but also the macro cell 42 to set the output values. This impedes an efficient sequential scan test.

The load on a test design tool when generating test patterns for the sequential scan test is described hereinafter with reference to the conceptual diagram of FIG. 6. FIG. 6 shows a macro cell 61 and logic cones ending at the input terminal DI of the macro cell 61. One of the illustrated logic cones is composed of combinational logic circuits 621 to 623 and begins at four flip-flops 611 to 614. In this case, setting four flip-flops by the scan shift allows setting one input terminal of the macro cell 61.

Generally, transition of the macro cell to a certain state requires setting a plurality of input terminals for the macro cell. If the number of input terminals is "n" and the number of flip-flops at the beginning of the logic cones that end at each input terminal is "A" on average, it is necessary to control the output of A*n number of flip-flops. The number of combinations of input patterns of all the flip-flops in this case is $2^{A*n}$. Thus, generating test patterns with the test design tool requires $2^{A*n}$ number of combinations for one clock cycle operation of the macro cell. The number of combinations required when setting the value of the flip-flops to 0/1 indicates "complexity", which is used as an index of difficulty in test pattern generation.

Moreover, since the output values of the macro cell cannot be determined in one clock cycle, the complexity further increases. For example, a RAM macro requires at least one clock cycle for writing data to an address and another one clock cycle for reading the data. A macro cell such as CPU requires several clock cycles from input of a command code to output of the result. Thus, if it is assumed that "m" number of internal state transitions are required to determine the output of the macro cell, since the complexity in one clock cycle operation of the macro cell is $2^{A*n}$, the entire complexity is $m*2^{A*n}$. Further, since the sequential scan is expected to detect delay faults in the path beginning or ending at a macro cell, if another macro cell exists in the logic cone to be tested, it is necessary to control a plurality of macro cells at the same time. The complexity in this case is expressed as a power of the number of macro cells compared to the complexity when only one macro cell exists. For example, the complexity when using "k" number of macro cells is $m^k*2^{Ank}$.

In contrast, in the case of the basic scan that bypasses the macro cells, the complexity is as small as $2^{Ak}$ since setting of only one input terminal of the macro cell is required. Thus, the sequential scan requires $m^k*2^{Ak(n-1)}$ times of the processing by the test design tool compared to the basic scan. As described above, the present invention has recognized that the sequential scan test for the LSI having a plurality of macro cells requires a heavy load on the test design tool and an extremely long processing time, which impedes the implementation of test design.

SUMMARY OF THE INVENTION

According to one aspect of the present invention, there is provided a semiconductor circuit apparatus which includes a scan chain formed of connected flip-flops; a first circuit section placed between the flip-flops included in the scan chain; and a second circuit section placed between the flip-flops included in the scan chain; and a selection circuit selecting whether to include the first circuit section in a scan-test path separately from selecting whether to include the second circuit section in the scan-test path. In this apparatus, a selection whether to include the second circuit section in a scan-test path is made independently of a selection whether to include the first circuit section in the scan-test path. This configuration allows independent control of selection whether to conduct scan test on the first circuit section and the second circuit section, thereby achieving efficient scan test design.

According to another aspect of the present invention, there is provided a semiconductor circuit apparatus on which a scan test can be conducted and which includes a scan chain formed of connected flip-flops; a first circuit section placed in a path between a first flip-flop and a second flip-flop included in the scan chain; a first bypass path bypassing the first circuit section in the path between the first flip-flop and the second flip-flop; a first selection circuit selecting a connection path connected to the first circuit section or the first bypass path; a second circuit section placed in a path between a third flip-flop and a fourth flip-flop included in the scan chain; a second bypass path bypassing the second circuit section in the path between the third flip-flop and the fourth flip-flop; and a second selection circuit selecting a connection path connected to the second circuit section or the second bypass path and capable of operating separately from the first selection circuit. This configuration allows independent control of selection whether to set a bypass of the first circuit section and the second circuit section, thereby achieving efficient scan test design.

According to still another aspect of the present invention, there is provided a scan test method for a semiconductor circuit apparatus at least including a first circuit section and a second circuit section. The method includes setting input values to a plurality of flip-flops included in a scan chain formed of connected flip-flops by shift operation of the scan chain; selecting whether to include the first circuit section in a scan-test path; selecting whether to include the second circuit section in the scan-test path independently of selecting whether to include the first circuit section in the scan-test path; and obtaining a processing result of the semiconductor circuit apparatus based on the input values. This method allows efficient scan test design.

The present invention provides a semiconductor circuit apparatus and a scan test method which allow efficient scan test design.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed. It is noted that in the description of the drawings the same elements will be denoted by the same reference symbols and redundant description will be omitted.

First Embodiment

Figure 1:
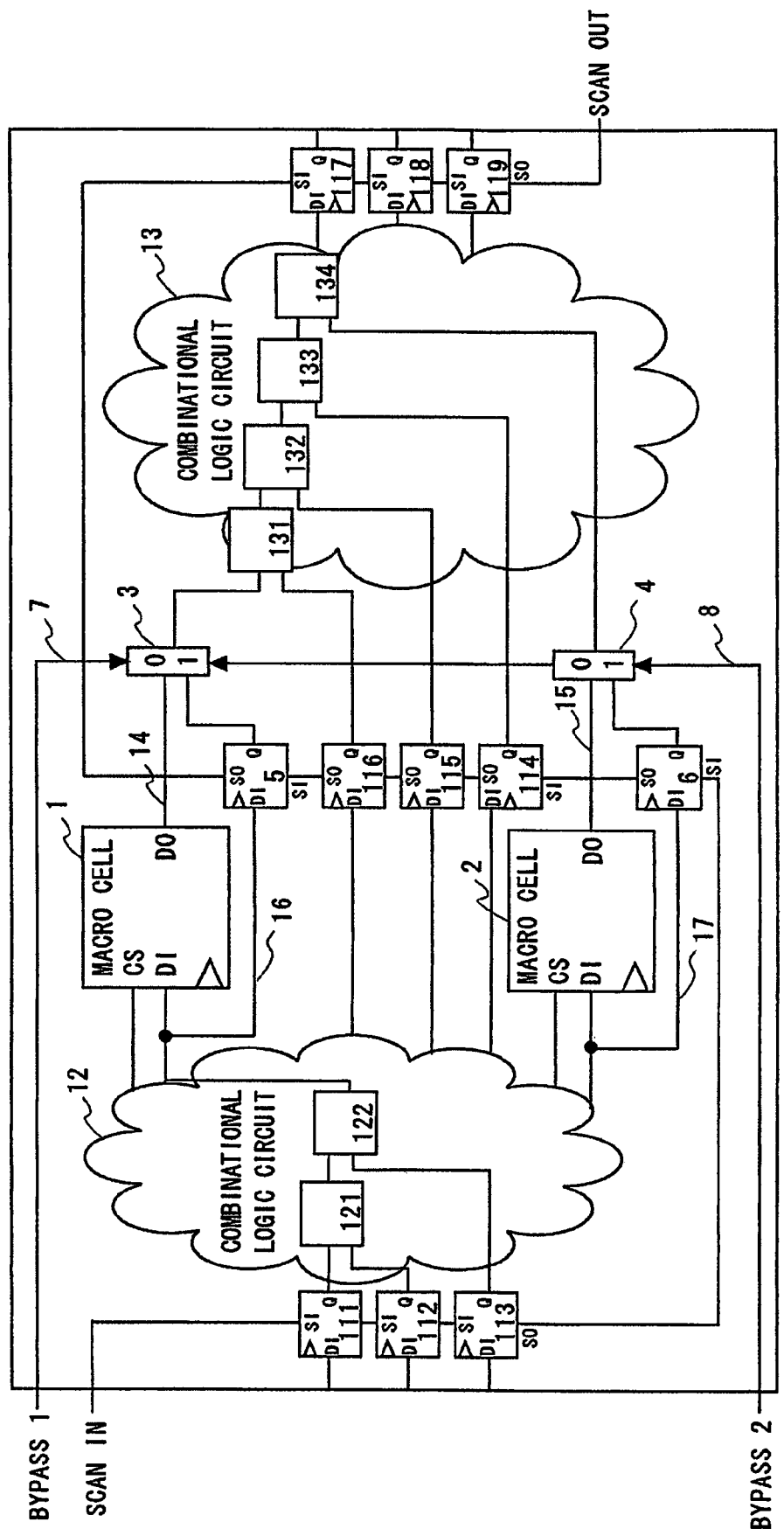
FIG. 1 is a block diagram of a semiconductor circuit apparatus according to a first embodiment of the invention.

FIG. 1 is a block diagram showing the principal part of an LSI according to a first embodiment of the invention. A macro cell 1 and a macro cell 2 each have a chip select terminal CS, a data input terminal DI, and a data output terminal DO. A selector 3 selects the operation by the macro cell 1 or the bypass of the macro cell 1. A bypass path 16 that bypasses the macro cell 1 connects the data input line of the macro cell 1 and the input of the selector 3. The selector 3 selects a path 14 connected to the data output terminal DO of the macro cell 1 or the bypass path 16. Similarly, a selector 4 selects the operation by the macro cell 2 or the bypass of the macro cell 2. A bypass path 17 that bypasses the macro cell 2 connects the data input line of the macro cell 2 and the input of the selector 4. The selector 4 selects a path 15 connected to the data output terminal DO of the macro cell 2 or the bypass path 17. The selectors 3 and 4 are controlled independently from each other by signals from separated external terminals BYPASS 1 and BYPASS 2 through selector control lines 7 and 8, respectively.

A combinational logic circuit 12 is composed of combinational logic circuits 121 and 122. A combinational logic circuit 13 is composed of combinational logic circuits 131, 132, 133, and 134. Flip-flops 111 to 119 are connected in series, forming a scan chain. Inputting data to an input terminal SCANIN and obtaining output from an output terminal SCANOUT allow controlling and observing the scan chain from outside. The macro cells 1 and 2 and the combinational logic circuits 12 and 13 are placed in the path between the flip-flops 111 to 119 of the scan chain. Further, flip-flops 5 and 6 are placed in the bypass paths 16 and 17, respectively, thus included in the scan chain like the flip-flops 111 to 119.

The operation in the fault detection test on the path that begins at the macro cell 1 and ends at the flip-flop 117 in the LSI of FIG. 1 is described below with reference to the timing chart of FIG. 2. The logic cone of this path includes the macro cell 2.

Figure 2:
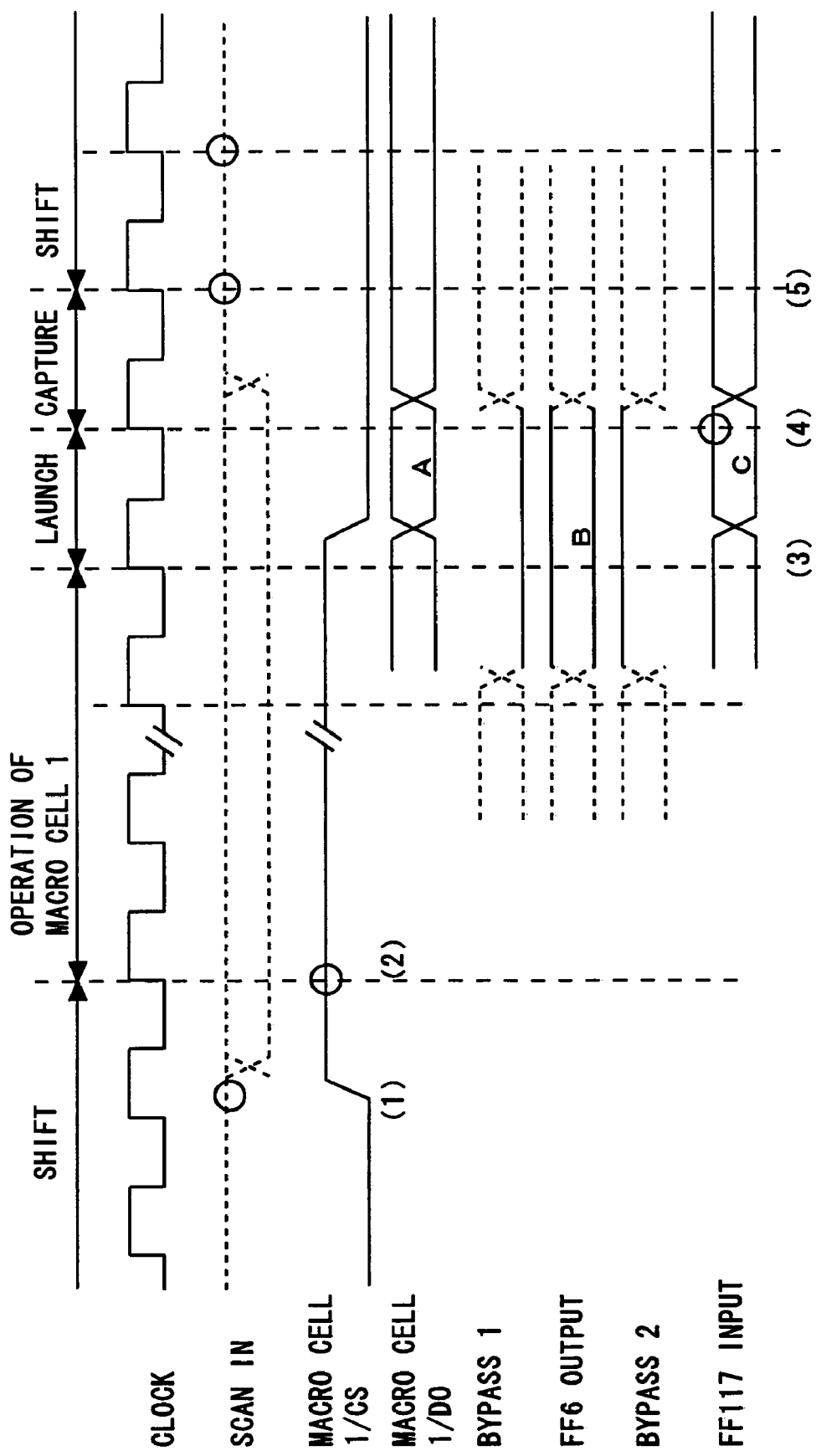
FIG. 2 is a timing chart showing the operation of the semiconductor circuit apparatus according to the first embodiment of the invention.

In FIG. 2, the rectangular wave of the clock shows the clock timing in the LSI. A macro cell 1/CS shows an input value "0" or "1" to the chip select terminal (CS terminal) of the macro cell 1. Input of "1" activates the macro cell to enter the operating state, and input of "0" inactivates the macro cell to enter the stopped state. A macro cell 1/DO shows output data from the macro cell 1. A BYPASS 1 shows a control signal to the selector 3. The signal "0" causes the selector 3 to select the output of the macro cell 1, and the signal "1" causes it to select the bypass path 16. A BYPASS 2 shows a control signal to the selector 4.

First, the scan shift is performed at the clock edge, (1) shown in FIG. 2, thereby activating the chip select terminal CS of the macro cell 1. Then, the macro cell 1 starts operating from the clock edge (2). FIG. 2 shows that the value of CS changes from "0" to "1" at the clock edge (1). After that, a series of scan operations consisting of scan shift, launch and capture are performed to set the input terminal of the macro cell 1. The series of scan operations are repeated to sequentially change the value of the input terminal so that the internal state transition occurs in the macro cell 1. As a result, desired data A is output from the macro cell 1/DO at the clock edge (3). For example, if the macro cell 1 is a RAM macro, the output data is determined as a result of two internal state transitions of writing operation to an address and reading operation from the address. At this time, the control signal from the BYPASS 1 to the selector 3 connected to the output of the macro cell 1 is set to the value "0" for selecting the output of the macro cell 1.

On the other hand, it is assumed that a specific output signal, B, for example, of the macro cell 2 is expected to be input to the combinational logic circuit 134 included in the path to be tested. The control signal from the BYPASS 2 to the selector 4 is set to the value "1" for selecting the data from the flip-flop 6. The flip-flop 6 is thereby set to output a desired signal B by the scan shift operation.

Thus, by launching the combinational logic circuits 131 to 134 based on the data A output from the macro cell 1 at the clock edge (3), it is possible to capture desired data C by the flip-flop 117 at the clock edge (4) without actually activating the macro cell 2 and obtaining an output signal B. After the clock edge (5), the shift operation is repeated, thereby outputting the data C from the output terminal SCANOUT. The test result is determined by checking whether the data C matches an expected value and whether an output delay occurs.

As described above, when conducting the sequential scan on the path beginning at the macro cell 1 and ending at the flip-flop 117, it is not required to activate another macro cell 2 which exists on the logic cone of the path to be tested to determine the output value. The sequential scan can be conducted if the output value is determined by the scan operation of the macro cell 1 only.

Figure 6:
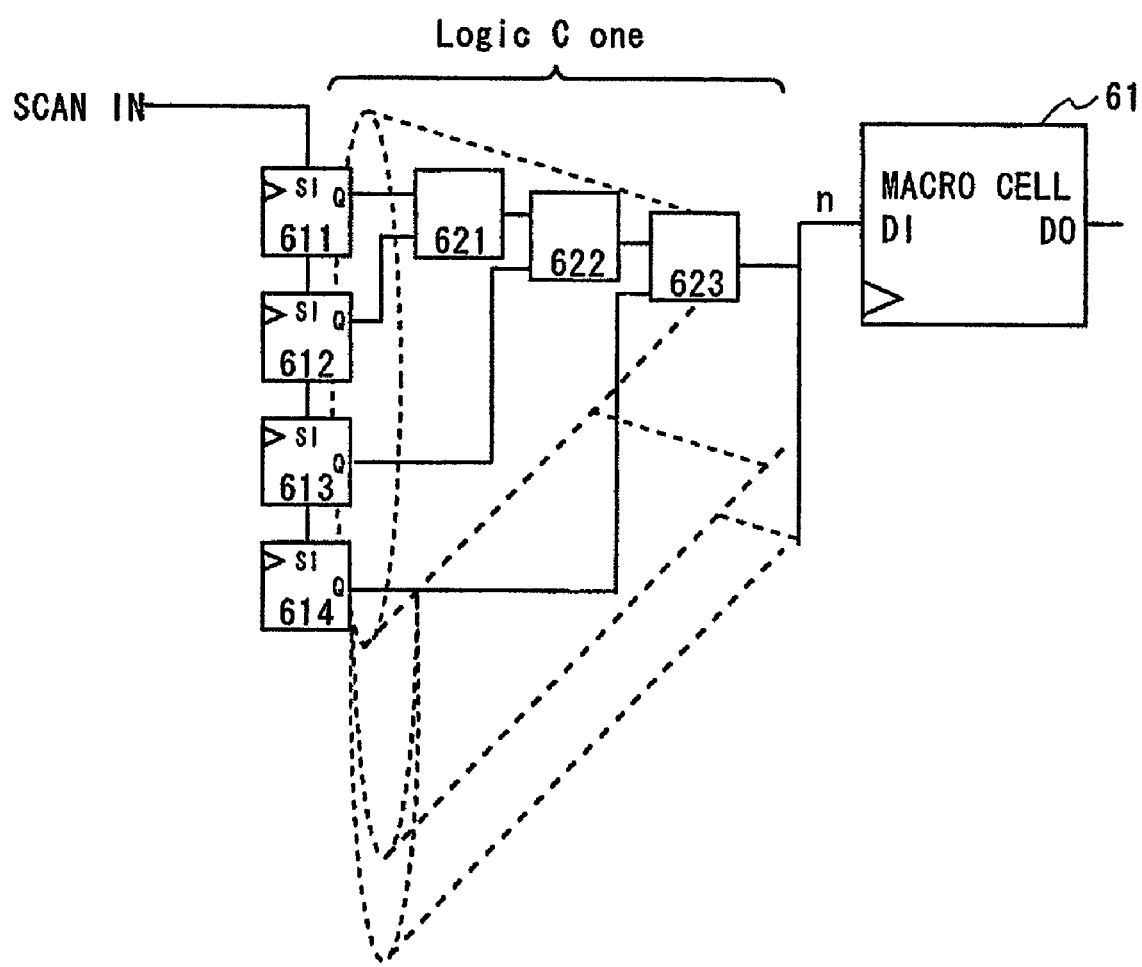
FIG. 6 is a conceptual diagram to explain the processing load on a test design tool.

Hence, if a plurality of macro cells exist in the logic cone of the path to be tested, this embodiment allows such a setting that activates one of the macro cells for data processing without bypassing it while bypassing other macro cells. In this case, the complexity, which is described earlier with reference to FIG. 6, is $m*2^{An}$, which is the same as the complexity in the case with a single macro cell. When conducting the sequential test, test patterns are generated by sequentially changing the macro cell that is not bypassed. The complexity in this case is $k*m*2^{An}$, which is proportional to the number of macro cells. Since the complexity is proportional to a power of the number of macro cells in the conventional technique described earlier, this embodiment significantly reduces the processing load on the test design tool.

As described in the foregoing, this embodiment allows external control of the setting of bypasses of macro cells independently for each macro cell so as to activate only the macro cell at the beginning or end of the path to be tested. It is thereby possible to reduce the number of test patterns required for the sequential scan test to achieve efficient testing.

Second Embodiment

Figure 3:
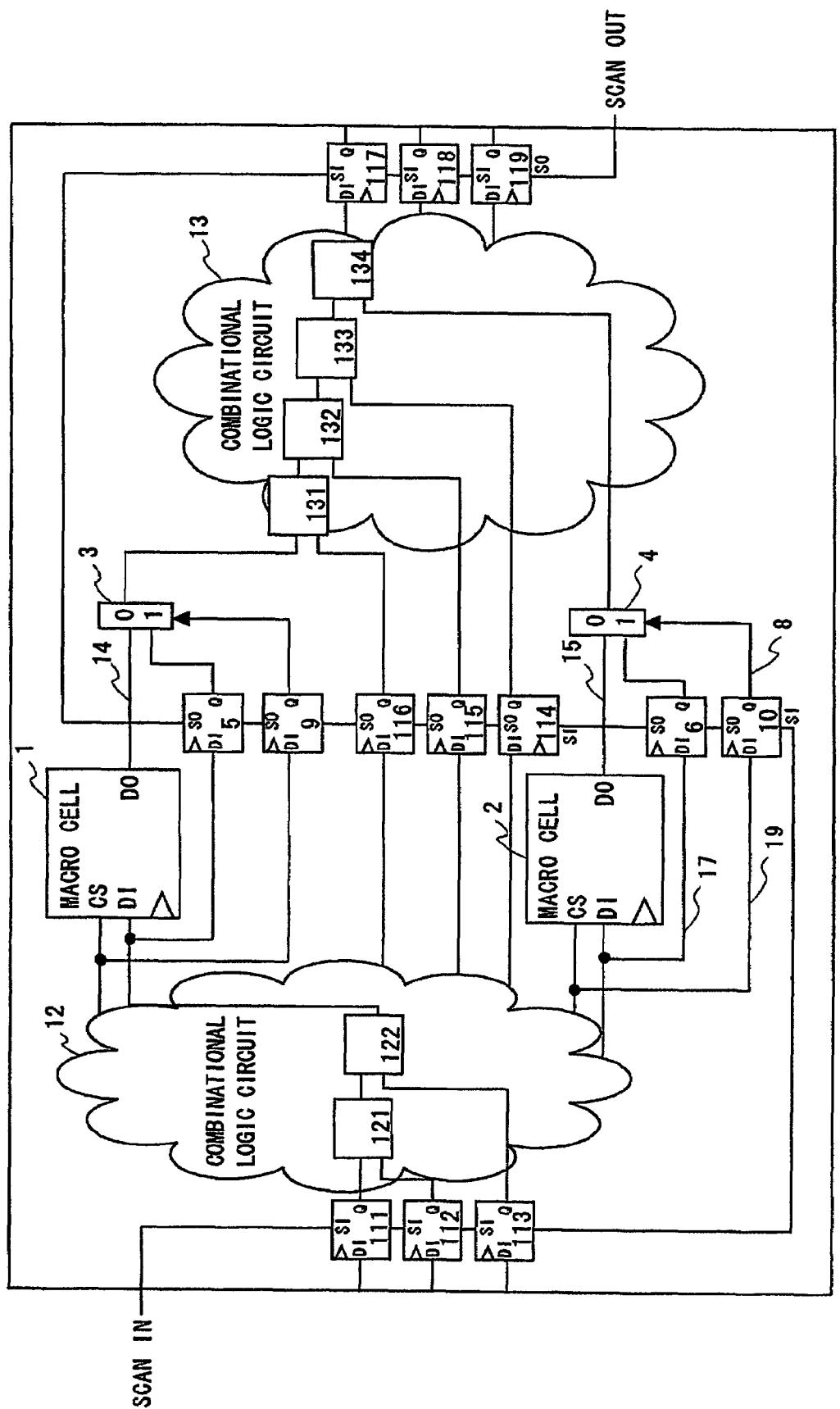
FIG. 3 is a block diagram of a semiconductor circuit apparatus according to a second embodiment of the invention.

FIG. 3 is a block diagram showing the principal part of an LSI according to a second embodiment of the invention. The first embodiment connects the control lines 7 and 8 of the selectors 3 and 4 to the external input terminals BYPASS 1 and BYPASS 2, respectively, placed in the chip so as to control the selectors from outside. This embodiment, on the other hand, connects the outputs of flip-flops 9 and 10 placed in the scan chain to the control terminals of the selectors 3 and 4, respectively. The selectors 3 and 4 are therefore controlled by setting values to the flip-flops 9 and 10 by the shift operation. Further, the flip-flops 9 and 10 receive CS signals from the macro cells 1 and 2, respectively. The flip-flops 9 and 10 thereby serve also as a flip-flop for detecting errors in a logic gate. This eliminates the need for additional flip-flops when detecting errors in the logic gate connected to the CS terminals of the macro cells 1 and 2.

Figure 4:
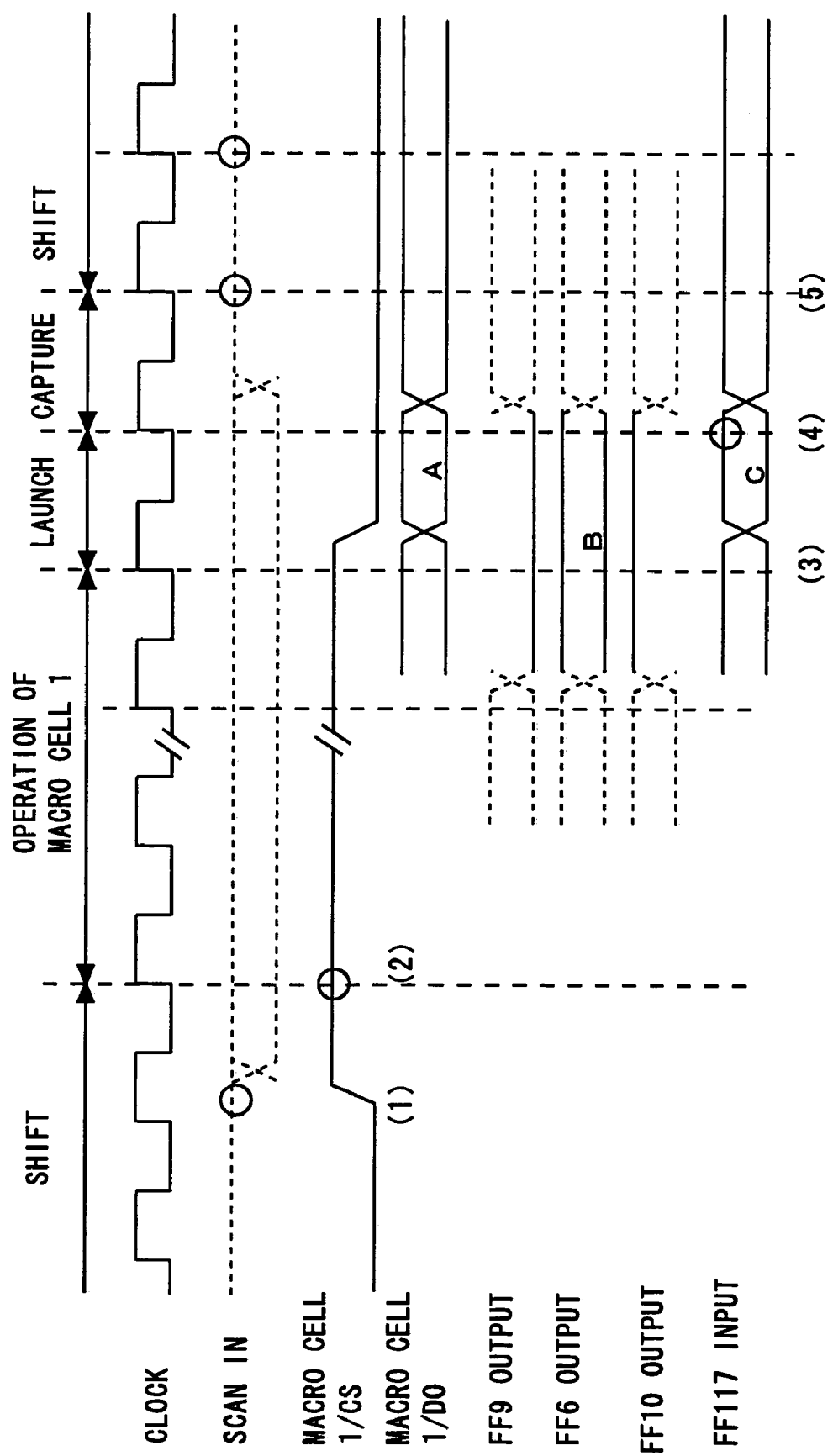
FIG. 4 is a timing chart showing the operation of the semiconductor circuit apparatus according to the second embodiment of the invention.
Figure 5:
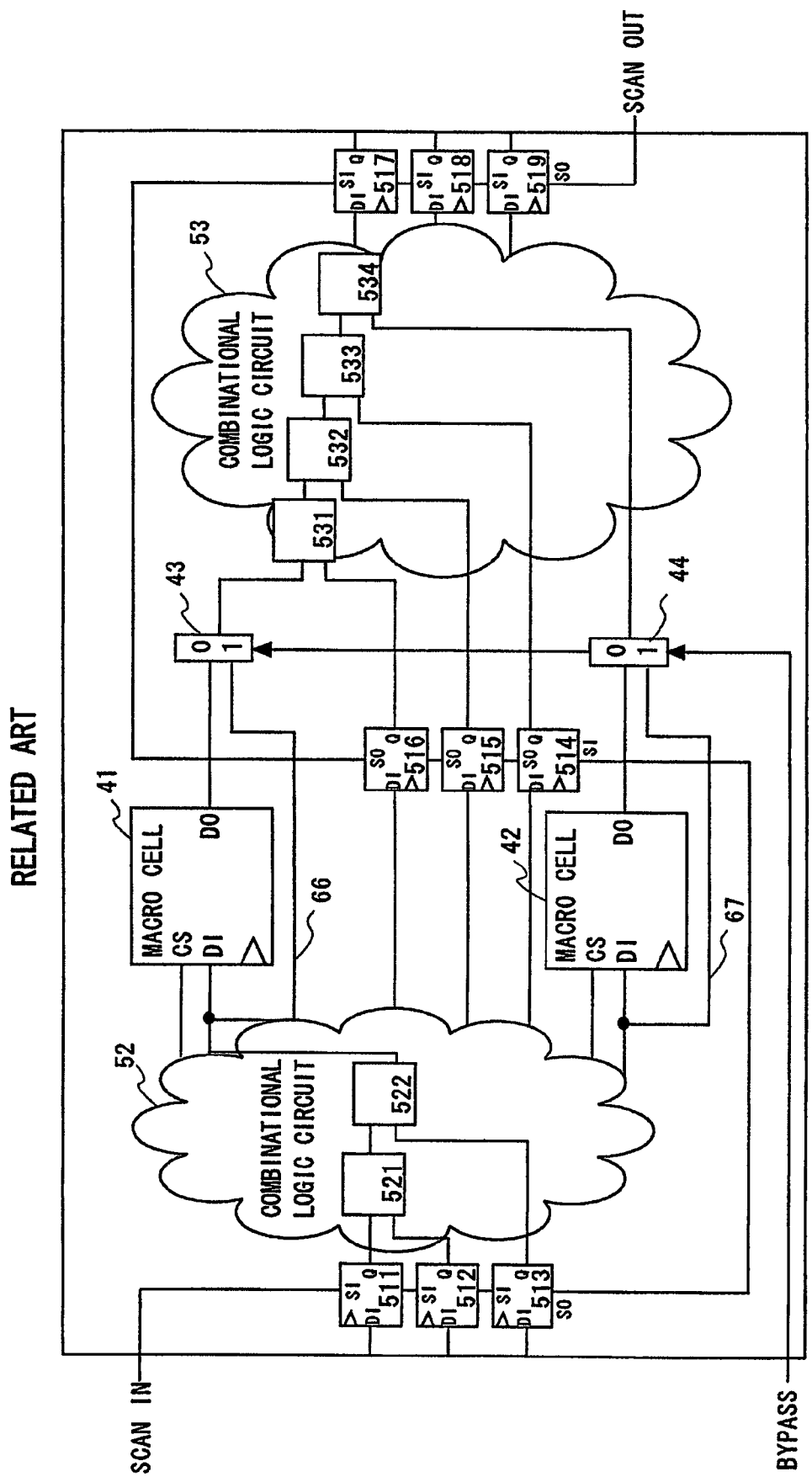
FIG. 5 is a block diagram of a conventional semiconductor circuit.

The timing chart of FIG. 4 shows the signals when performing the test operation described in the first embodiment with reference to FIG. 2 in the configuration of this embodiment. FF9 output and FF10 output of FIG. 4 correspond to the BYPASS 1 and the BYPASS 2 of FIG. 2, respectively.

In this embodiment, the control values to the selectors 3 and 4 can be set by as late as the clock edge (3). Setting the values of the flip-flops 9 and 10 by the scan shift operation by this timing allows the selectors 3 and 4 to perform the selecting operation at the same timing as when setting the values from the BYPASS 1 and BYPASS 2. This eliminates the need for placing the terminals BYPASS 1 and BYPASS 2 for bypassing the macro cells on the chip, which avoids exceeding the limit of the number of terminals on a package and increasing costs due to an increase in the number of terminals.

It is apparent that the present invention is not limited to the above embodiment that may be modified and changed without departing from the scope and spirit of the invention.

What is claimed is:

1. A device comprising:
   a plurality of scan flip-flops forming a scan chain, each of the flip-flops having a data input and a scan input connected functionally to control, respectively, a data output and a scan output, in accordance with a clock signal;
   a first circuit receiving as inputs a first data signal and a first circuit select signal, the first circuit being constructed so as to output a second data signal;
   a first flip-flop belonging to said scan chain and outputting a third data signal at the data output of the first flip-flop, the data input of the first flip-flop receiving the first data signal;
   a second flip-flop belonging to said scan chain and outputting a first selector signal at the data output of the second flip-flop, the data input of the second flip-flop receiving the first circuit select signal; and
   a first selector receiving said second data signal and said third data signal as data inputs, the first selector receiving the first selector signal as a selection input, the first selector outputting one of said second and third data signals based on a level of the first selector signal.

2. The device according to claim 1, wherein said first flip-flop is able to capture said first data signal.

3. The device according to claim 1, further comprising:
   a second circuit receiving as inputs a fourth data signal and a second circuit select signal, the second circuit being constructed so as to output a fifth data signal;
   a third flip-flop belonging to said scan chain and outputting a sixth data signal at the data output of the third flip-flop, the data input of the third flip-flop receiving the fourth data signal;
   a fourth flip-flop belonging to said scan chain and outputting a second selector signal at the data output of the fourth flip-flop, the data input of the fourth flip-flop receiving the second circuit select signal; and
   a second selector receiving said fifth data signal and said sixth data signal as data inputs, the second selector receiving the second selector signal as a selection input, the second selector outputting one of said fifth and sixth data signals based on a level of the second selector signal.

4. The device according to claim 3, wherein said third flip-flop is able to capture said fourth data signal.

5. The device according to claim 3, wherein said first selector and said second selector are controlled independently of one another.

6. The device of claim 1, wherein the scan output of the second flip-flop is connected to the scan input of the first flip-flop.

7. The device of claim 3, wherein the scan output of the second flip-flop is connected to the scan input of the first flip-flop, and the scan output of the fourth flip-flop is connected to the scan input of the third flip-flop.

8. The device of claim 3, wherein the first circuit outputs the second data signal corresponding to the second data signal by a plurality of clock cycle operations, and wherein the second circuit outputs the fifth data signal corresponding to the fifth data signal by a plurality of clock cycle operations.

9. The device of claim 7, wherein the first circuit outputs the second data signal corresponding to the second data signal by a plurality of clock cycle operations, and wherein the second circuit outputs the fifth data signal corresponding to the fifth data signal by a plurality of clock cycle operations.

10. A scan test method for a semiconductor circuit apparatus, comprising steps of:
    providing a semiconductor circuit comprising:
    a plurality of scan flip-flops forming a scan chain, each of the flip-flops having a data input and a scan input connected functionally to control, respectively, a data output and a scan output, in accordance with a clock signal;
    a first circuit receiving as inputs a first data signal and a first circuit select signal, the first circuit being constructed so as to output a second data signal;
    a first flip-flop belonging to said scan chain and outputting a third data signal at the data output of the first flip-flop, the data input of the first flip-flop receiving the first data signal;
    a second flip-flop belonging to said scan chain and outputting a first selector signal at the data output of the second flip-flop, the data input of the second flip-flop receiving the first circuit select signal; and
    a first selector receiving said second data signal and said third data signal as data inputs, the first selector receiving the first selector signal as a selection input, the first selector outputting one of said second and third data signals based on a level of the first selector signal;

performing a scan shift by supplying a predetermined data sequence to an input of the scan chain in coordination with controlling a clock input to each of the scan flip-flops in the scan chain;

activating the first circuit through the predetermined data sequence;

capturing said output of the first selector in the flip-flops in the scan chain; and shifting data stored in the scan chain reflecting operation of the semiconductor circuit apparatus outside the semiconductor circuit apparatus, wherein the predetermined data sequence is selected so as to control whether the output of the first selector reflects operation of the first circuit or a bypass of the first circuit.

11. The method of claim 10, wherein the method further comprises:

further providing in the semiconductor apparatus:

a second circuit receiving as inputs a fourth data signal and a second circuit select signal, the second circuit being constructed so as to output a fifth data signal;

a third flip-flop belonging to said scan chain and outputting a sixth data signal at the data output of the third flip-flop, the data input of the third flip-flop receiving the fourth data signal;

a fourth flip-flop belonging to said scan chain and outputting a second selector signal at the data output of the fourth flip-flop, the data input of the fourth flip-flop receiving the second circuit select signal; and a second selector receiving said fifth data signal and said sixth data signal as data inputs, the second selector receiving the second selector signal as a selection input, the second selector outputting one of said fifth and sixth data signals based on a level of the second selector signal;

activating the second circuit through the predetermined data sequence; and capturing said output of the second selector in the flip-flops in the scan chain, wherein the predetermined data sequence is further selected so as to control whether the output of the second selector reflects operation of the second circuit or a bypass of the second circuit, the semiconductor circuit apparatus being constructed and arranged so that selection of the output of the second selector can be made independent of the selection of the output of the first selector.

12. The method of claim 10, wherein the scan output of the second flip-flop is connected to the scan input of the first flip-flop.

13. The method of claim 11, wherein the scan output of the second flip-flop is connected to the scan input of the first flip-flop, and the scan output of the fourth flip-flop is connected to the scan input of the third flip-flop.

14. The method of claim 11, wherein the first circuit outputs the second data signal corresponding to the second data signal data by a plurality of clock cycle operations, and wherein the second circuit outputs the fifth data signal corresponding to the fifth data signal by a plurality of clock cycle operations.

15. The method of claim 13, wherein the first circuit outputs data corresponding to input data by a plurality of clock cycle operations, and wherein the second circuit outputs data corresponding to input data by a plurality of clock cycle operations.

* * * * *